United States Patent [19]
Freitas

[11] Patent Number: 5,323,068
[45] Date of Patent: Jun. 21, 1994

[54] LOW POWER LOW TEMPERATURE ECL OUTPUT DRIVER CIRCUIT

[75] Inventor: Oscar W. Freitas, Cape Elizabeth, Me.

[73] Assignee: National Semiconductor Corporation, Santa Clara, Calif.

[21] Appl. No.: 977,812

[22] Filed: Nov. 17, 1992

[51] Int. Cl.$^5$ .................. H03K 19/086; H03K 3/26; H03K 17/14
[52] U.S. Cl. ...................... 307/455; 307/310; 307/443
[58] Field of Search ............... 307/455, 443, 475, 494, 307/310

[56] References Cited
U.S. PATENT DOCUMENTS

| | | | |
|---|---|---|---|
| 4,620,115 | 10/1986 | Lee et al. | 307/475 |
| 4,745,304 | 5/1988 | Wilson | 307/455 |
| 4,748,346 | 5/1988 | Emori | 307/455 |
| 4,751,406 | 6/1988 | Wilson | 307/455 |
| 4,853,646 | 8/1989 | Johnson et al. | 330/256 |
| 5,013,938 | 5/1991 | Estrada | 307/455 |
| 5,025,179 | 6/1991 | Freitas | 307/455 |
| 5,172,015 | 12/1992 | Barre | 307/455 |
| 5,237,216 | 8/1993 | Hayano et al. | 307/310 |

*Primary Examiner*—Edward P. Westin
*Assistant Examiner*—Benjamin D. Driscoll
*Attorney, Agent, or Firm*—Daniel H. Kane; Richard C. Calderwood; Stephen R. Robinson

[57] ABSTRACT

A temperature compensated ECL output driver circuit incorporates an ECL output gate (Q4,Q3) coupled between high (V$_{CC}$) and low (V$_{EE}$) potential power rails with output voltage swing resistors (R2, R1). The ECL output gate provides an output node (N1) at the collector node of one of the ECL output gate transistors (Q4). A first current sink (Q5,R4) is coupled between the common emitter node coupling (N3) of the ECL output gate (Q4,Q3) and low potential power rail (V$_{EE}$). A compensating current source (Q11,R5) is coupled to the ECL output gate output node (N1) for generating a supplementary compensating current during operation of the ECL output driver circuit in intermediate and high temperature operating ranges. A compensating current switch (Q9,Q10) is coupled in the compensating current path and is constructed for switching off the supplementary compensating current in a specified low temperature operating range to maintain the logic high output signal V$_{OH}$ within specifications. The compensating current switch is an ECL compensating current switch (CCS) gate (Q9,Q10) and the compensating current source is a second current sink (Q11,R5) coupled to the ECL CCS gate.

17 Claims, 2 Drawing Sheets

LOW POWER LOW TEMPERATURE ECL OUTPUT DRIVER CIRCUIT

TECHNICAL FIELD

This invention relates to a new ECL output driver circuit capable of operation in a low temperature range at relatively low power while still maintaining the potential level of a logic high output signal $V_{OH}$ at the output $V_{OUT}$ within a desired $V_{OH}$ specification range. The invention supplements the conventional temperature compensating crossover network coupled between collector nodes of the ECL output gate transistors with additional circuit compensation for low power low temperature operation.

BACKGROUND ART

A conventional temperature compensated ECL output driver circuit is illustrated in FIG. 1. An ECL output gate having first and second ECL output gate transistors Q4,Q3 with a first common emitter node coupling N3 is coupled between high $V_{CC}$ and low $V_{EE}$ potential power rails. The ECL output gate transistors Q4,Q3 provide alternative collector current paths through respective collector node output voltage swing resistors R2,R1 according to a data input signal at a base node input $V_{IN}$ of the ECL output gate transistor Q3. A first current sink Q5,R4 is coupled between the common emitter node coupling N3 of the ECL output gate transistors and low potential power rail $V_{EE}$. At least one emitter follower transistor output circuit Q12 is coupled to a collector node output N1 of the ECL output gate transistor Q4 for delivering logic high $V_{OH}$ and logic low $V_{OL}$ potential level output signals at an output $V_{OUT}$. A temperature compensating crossover network Q1,Q2,R3 is coupled between collector nodes N1,N2 of the respective ECL output gate transistors Q4,Q3.

Disadvantages of the conventional ECL output driver circuit of FIG. 1 occur during operation in the relatively low temperature range of, for example, $-10°$ C. or $-20°$ C. to $-55°$ C. Relevant operating currents and voltage drops in the ECL output driver circuit vary with temperature because of the negative temperature coefficient of the base emitter voltage drops $V_{BE}$ across the base emitter junctions of the bipolar transistors, and the positive temperature coefficient of the doped semiconductor material resistors. At very low temperatures the amplification factor $\beta$ of the bipolar transistors may decrease for example from 100 at room temperature to e.g. 50 at $-55°$ C. In particular, as the operating temperature of the ECL output driver circuit falls through the low temperature range, the base current $I_BQ12$ through output emitter follower transistor Q12 during the logic high potential level signal $V_{OH}$ at the ECL output gate output $V_{OUT}$ increases.

Approaching, for example, $-55°$ C., the base current $I_BQ12$ becomes a non-negligible factor in the voltage drop $V_{R2}$ across output voltage swing resistor R2. Typically, the output base current $I_BQ12$ may be neglected at intermediate and high temperature operating ranges relative to the large collector currents through respective bipolar transistors for a logic high potential level signal at the output node N1 and final output $V_{OUT}$. By way of example, $V_{R2}$ remains approximately, e.g. 0.15 v. At the low temperature operating ranges of $-10°$ C. or $-20°$ C. to $-55°$ C. required for example for military specifications, however, the voltage drop $V_{R2}$ across output voltage swing resistor R2 may increase to the extent that the voltage level of the final output high signal $V_{OH}$ falls below the permitted specification range, of, e.g., $-0.870$ v ($V_{OHMAX}$) to $-1.085$ v ($V_{OHMIN}$) and the preferred nominal value for $V_{OH}$ of $-0.95$ v.

According to conventional methods of maintaining specifications for the output high signal $V_{OH}$ in the low temperature operating range, the collector path resistor R2 which along with R1 and R4 sets the swing voltage at the output node N1, is selected to have a relatively low resistance value. This permits the output logic high signal $V_{OH}$ to remain within the permitted specification range even at low temperature, as the base current $I_BQ12$ increases. The logic high potential output signal $V_{OH}$ at the final output $V_{OUT}$ is given by the equation:

$$V_{OH}=V_{CC}-(V_{R2}+V_{BE}Q12)\approx -0.95 \text{ v} \qquad 1)$$

The ECL output gate current sink Q5,R4 is generally operated with a current source voltage $V_{CS}$ so that:

$$V_{CS}=V_{R4}+V_{BE}Q5\approx 1.32 \text{ v} \qquad 2)$$

and:

$$V_{R2}=R2/R4 \; V_{R4}. \qquad 3)$$

Swing voltage resistors R1,R2 are generally selected to have the same resistance value and tail resistor R4 is selected to have a resistance value substantially one half that of R1,R2. If the resistance value of R1,R2 is reduced to meet military specifications, the current sink tail resistor R4 is therefore also required to have a lower resistance value with the result that there is higher current and higher power dissipation necessary for operation in the low temperature range while meeting specifications for $V_{OH}$.

It is noted that the conventional temperature compensating network Q1,Q2,R3 coupled between collector nodes N1,N2 of ECL output gate transistors Q4,Q3 provides temperature compensation only in the intermediate and high temperature operating ranges. The swing voltage difference of the logic high and low levels of approximately 750 mV between N1 and N2 causes a "bleed" current to flow across the network which varies with temperature to provide temperature compensation for the output base drive current $I_BQ12$ in the intermediate and high temperature ranges. In the low temperature range noted above, the bleed current of the conventional temperature compensating crossover network saturates at approximately $-10°$ C. to $-20°$ C. and the compensating crossover network is essentially inoperative from $-10°$ C. or $-20°$ C. to $-55°$ C. The output base drive current and the value of $V_{OH}$ are then dependent only on the value of R2 and the voltage drop $V_{R2}$ which may be too large to keep $V_{OH}$ within required specifications. It is for this reason that low values are selected for R2 and R4 increasing current and power dissipation for example from 2.8 mA to 4.3 mA.

OBJECTS OF THE INVENTION

It is therefore an object of the present invention to provide a new ECL output driver circuit that meets specifications for the logic high level output signal $V_{OH}$ while operating at relatively low power in the low temperature operating range required, for example, by military specifications. An advantage of the low power ECL output driver circuit is that it also reduces power requirements for internal gates coupled to the output driver circuit.

Another object of the invention is to provide a low power low temperature operating ECL output driver circuit with slower edge rates for reducing output related noise.

A further object of the invention is to supplement the conventional temperature compensating crossover network with additional compensation in the intermediate and high temperature ranges and for low power operation in the low temperature range of e.g. −10° C. to −55° C.

DISCLOSURE OF THE INVENTION

In order to accomplish these results the invention provides a compensating current source coupled to the ECL output gate output node N1 for generating a supplementary compensating current during operation of the ECL output driver circuit in intermediate and high temperature operating ranges. The supplementary compensating current is generated in a compensating current path through the output voltage swing resistor coupled to the output node N1 and permits operation of the first current sink of the ECL output gate at relatively low power. The invention also provides a compensating current switch coupled in the compensating current path and constructed for switching off the supplementary compensating current in a specified low temperature operating range to maintain the logic high output signal voltage level $V_{OH}$ within a desired specification range.

In the preferred example the compensating current switch is an ECL compensating current switch (CCS) gate and the compensating current source is a second current sink coupled between the ECL CCS gate and low potential power rail. The ECL CCS gate is coupled between the high and low potential power rails and includes first and second CCS gate transistors with a second common emitter node coupling N4.

The preferred example also incorporates a stack of n voltage drop components having a negative temperature coefficient coupled between the high potential level power rail and a base node of the first ECL CCS gate transistor. A third current sink is coupled between the stack and low potential power rail for establishing a first voltage drop across the stack.

A compensating reference voltage source is coupled between the high potential power rail and a base node of the second ECL CCS gate transistor. The compensating reference voltage source is selected to provide a second voltage drop slightly greater than the first voltage drop at intermediate and high temperature ranges for normally operating the CCS gate with the first CCS gate transistor conducting. A supplementary compensating current therefore flows through the output voltage swing resistor coupled to the ECL output gate output node N1 to permit low power operation of the first current sink.

The stack of voltage drop components is selected to provide a first voltage drop greater than the reference voltage source second voltage drop at a specified low temperature range of operation of the ECL output driver circuit to cut off the supplementary compensating current.

The invention also sets forth a new method of operating an ECL output driver circuit for low power operation in a low temperature range. The method proceeds by sinking a first current through the output voltage swing resistor in a first current path through the first ECL output gate transistor and first common emitter node N3. Further steps include sinking a supplementary compensating second current through the output voltage swing resistor, output node N1, and through a separate compensating current path to the low potential power rail in parallel with the first current path. The method provides the steps of maintaining the supplementary compensating current through the output voltage swing resistor during intermediate and high temperature operation of the ECL output driver circuit and switching off the supplementary compensating current in a low temperature operating range of the ECL output driver circuit.

Other objects, features and advantages of the invention are apparent in the, following specification and accompanying drawings.

DESCRIPTION OF PREFERRED EXAMPLE EMBODIMENTS AND BEST MODE OF THE INVENTION

Figure 1:
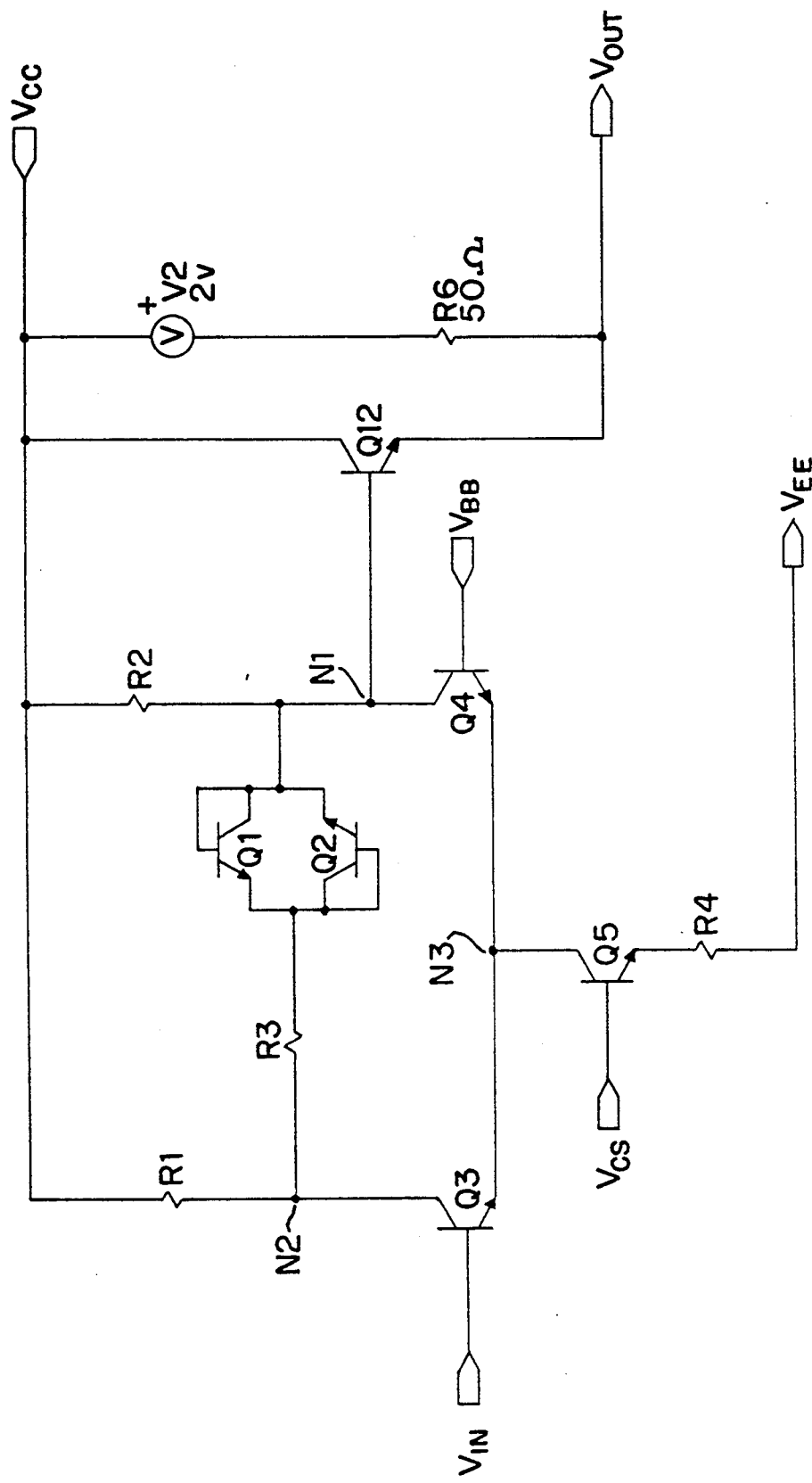
FIG. 1 is a schematic circuit diagram of a prior art ECL output driver circuit.
Figure 2:
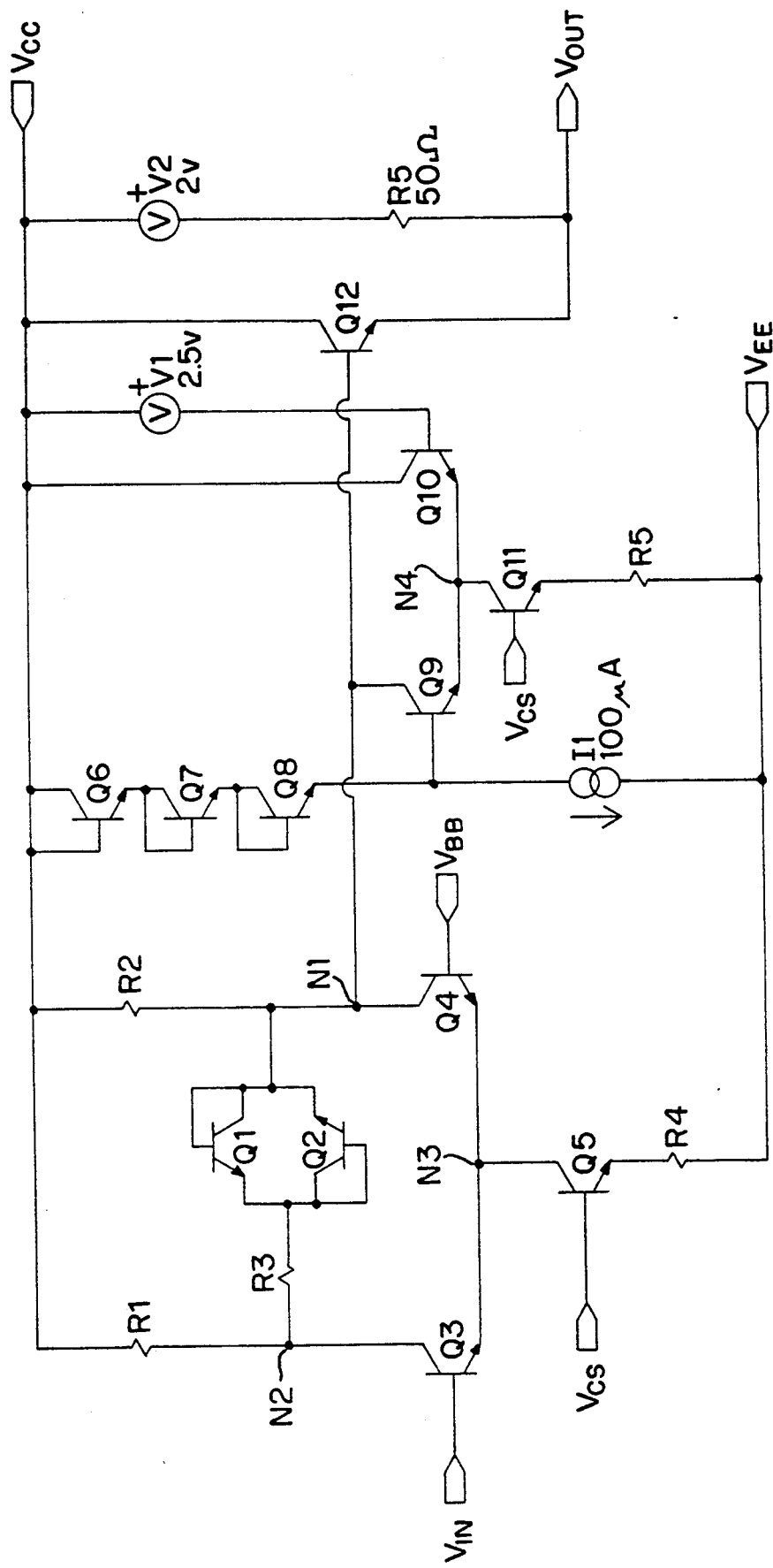
FIG. 2 is a schematic circuit diagram of an ECL output driver circuit for low power operation at low temperature according to the invention

An ECL output driver circuit constructed for operation at low power and low temperature according to the invention is illustrated in FIG. 2. Circuit components performing substantially the same function as illustrated in FIG. 1 are indicated by the same reference designations. As shown in FIG. 2 a compensating circuit is added so that the current $I_{R2}$ passing through output voltage swing resistor R2 is a function of two current sources or current sinks. As a result, swing resistor R2 can be selected to have a relatively low resistance value while achieving a sufficient voltage drop $V_{R2}$ across resistor R2 to maintain a desired swing voltage between high and low potential signals at collector nodes N1 and N2 of, for example, 750 mV. At the same time tail resistor R4 can be selected to have a relatively high resistance value for operation of the ECL output gate current sink at relatively low power. By switching off the second current sink of the compensating circuit in the low temperature operating range, the current $I_{R2}$ can be reduced to maintain a logic high output signal $V_{OH}$ within desired $V_{OH}$ specifications.

The compensating circuit is provided by an ECL compensating current switch (CCS) gate having first and second CCS gate transistors Q9,Q10 coupled together at a common emitter node N4. The first ECL CCS gate transistor Q9 is coupled in a compensating current path between ECL output gate output node N1 and the second common emitter node N4 and second current sink Q11,R5. The compensating current source is a second current sink consisting of current source transistor Q11 and tail resistor R5. A current source voltage $V_{CS}$ is applied at the base node of current source transistor Q11 and is derived, for example, from a temperature compensated voltage source or bias generator. The same current source voltage $V_{CS}$ is also applied at the base node of the first current sink current source transistor Q5. The second ECL CCS gate transistor Q10 is coupled between the high potential power rail $V_{CC}$ and the second common emitter node N4 and second current sink Q11,R5.

With ECL CCS gate transistor Q9 conducting, the second current sink Q11,R5 is sized to generate a tail current and therefore a compensating current in the compensating current path of R2,N1,Q9,N4, and Q11 of, for example, 0.3 mA when transistor Q9 is fully conducting in the standard intermediate operating temperature ranges. The compensating current in this example is approximately 1/10 the tail current generated by the primary current sink Q5,R4 coupled to the ECL output gate Q4,Q3.

A diode stack of three series coupled base collector shorted (BCS) transistors Q6,Q7,Q8 is coupled between the high potential power rail $V_{CC}$ and the base node of the first CCS gate transistor Q9. A third current sink or current source I1 generating a small bias current of, for example, 100 $\mu$A is coupled between the diode stack Q6,Q7,Q8 and the low potential power rail $V_{EE}$ to establish a voltage drop of 3 $V_{BE}$ across the diode stack. The base node of first CCS gate transistor Q9 is therefore held at a voltage level of 3 $V_{BE}$ below $V_{CC}$.

At room temperature and intermediate operating temperature ranges 1 $V_{BE}$ is approximately 0.8 v for a bias voltage of $V_{CC}-2.4$ v at the base node of first CCS gate transistor Q9. A compensating reference bias voltage V1 of e.g. 2.5 v is applied at the base node of the second CCS gate transistor Q10. At the intermediate and high temperature operating ranges, Q9 is therefore conducting the compensating current in the compensating current path through R2,N1,Q9,N4, and Q11. Actually the CCS gate turns on the first transistor Q9 at a temperature between $-10°$ C. and $0°$ C. As the temperature increases the compensating current increases to the limit of the current sink Q11,R5 of, for example, 0.3 mA.

At the same time the first current sink Q5,R4 generates a primary current in the order of for example 2.8 mA in the ECL output gate in a primary current path through R2,N1,Q4,N3, and Q5. The combined current $I_{R2}$ through output voltage swing resistor R2 is sufficient to assure the full swing voltage of e.g. 0.750 v (750 mV) between logic high and low potential level signals at the collector nodes N1,N2 and between logic high and low potential level signals $V_{OH}$, $V_{OL}$ at the final output $V_{OUT}$.

As temperature decreases below approximately $-10°$ C., the negative temperature coefficient of the 3 $V_{BE}$ voltage drop across diode stack Q6,Q7,Q8 causes the voltage drop to increase driving down the bias voltage at the base node of first CCS gate transistor Q9 below the bias voltage at the base of the second CCS gate transistor Q10. In the low temperature range of for example from $-10°$ C. to $-55°$ C. only the primary current generated by the primary current sink Q5,R4 flows through output voltage swing resistor R2 reducing the voltage drop $V_{R2}$ and maintaining the logic high output signal voltage level $V_{OH}$ within the desired specification range below $V_{CC}$, for example $-0.870$ v ($V_{OH-MAX}$) and $-1.085$ v ($V_{OHMIN}$).

In the compensating circuit configuration illustrated in FIG. 2 for a 2.8 mA output buffer circuit, the resistance value of output voltage swing resistor R2 may be reduced from a typical prior art value of 400 ohms to a resistance value of, for example, 340 ohms. Resistor R2 is typically an N+ sink implant resistor. At this relatively low resistance value, the logic high output signal voltage level $V_{OH}$ remains at the desired high level during operation at low temperature. As the base drive current $I_BR2$ at the base node of emitter follower output transistor Q12 increases, the smaller value of R2 keeps the voltage drop $V_{R2}$ within acceptable limits for the logic high signal at the output $V_{OUT}$. At the same time the necessary voltage swing between ECL output gate collector nodes N1 and N2 remains acceptable across the operating temperature ranges because of the compensating current added by the second current sink Q11,R5. Furthermore, the resistance value of tail resistor R4 is maintained at the comparable prior value of 190 ohms for reduced power. Typical values for resistors of the circuit of FIG. 2 are set forth in the following TABLE I.

TABLE I

| Resistor | Resistance |
|---|---|
| R1 | 340Ω |
| R2 | 340Ω |
| R3 | 340Ω |
| R4 | 190Ω |
| R5 | 2000Ω |

The combination of the relatively smaller resistance value for R2 and the addition of the supplementary compensating current achieves a flatter voltage drop across respective components to the output $V_{OUT}$ and in particular a flat $V_{OH}$ signal response at the output $V_{OUT}$ at low temperature. The voltage swing or voltage excursion for logic high and low potential signals is maintained at nodes N1 and N2. Power consumption is reduced by 28% in comparison with power consumption using prior art resistance values for tail resistor R4. In the preferred examples the resistance values of R2 and R4 are selected so that R2 is less than 1.8 times R4. The added capacitance of the compensating circuit also has the beneficial effect of slowing edge rates and reducing associated noise in the power rails.

While the invention has been described with reference to particular example embodiments it is intended to cover all modifications and equivalents within the scope of the following claims.

I claim:
1. A temperature compensated ECL output driver circuit comprising an ECL output gate coupled between high and low potential power rails and having first and second ECL output gate transistors with a first common emitter node coupling providing alternative collector current paths through respective output voltage swing resistors according to data input signals at a base node input of one of the ECL output gate transistors, said ECL output gate providing an output node at the collector node of one of the ECL output gate transistors, and a first current sink coupled between the first common emitter node coupling and low potential power rail, the improvement for operation of the ECL output driver circuit at low power and low temperature comprising:

a compensating current source coupled to the ECL output gate output node for generating a supplementary compensating current during operation of the ECL output driver circuit in intermediate and high temperature operating ranges in a compensating current path through the output voltage swing resistor coupled to said output node to permit operation of the first current sink of the ECL output gate at relatively low power;

and an ECL compensating current switch (CCS) gate coupled in the compensating current path and constructed for switching off the supplementary compensating current in a specified low temperature operating range.

2. The ECL output driver circuit of claim 1 wherein the compensating current source is a second current sink coupled between the ECL CCS gate and low potential power rail.

3. The ECL output driver circuit of claim 1 wherein the compensating current switch is an ECL compensating current switch (CCS) gate coupled between the high and low potential power rails and comprising first and second CCS gate transistors with a second common emitter node coupling, the first CCS gate transistor being coupled in the compensating current path between the ECL output gate output node and second common emitter node, and wherein the compensating current source is a second current sink coupled between the second common emitter node and low potential power rail.

4. The ECL output driver circuit of claim 3 wherein the ECL output gate comprises an emitter follower transistor output circuit coupled to the ECL output gate output node for delivering logic high and logic low potential level output signals at an output, and a temperature compensating network coupled between respective collector nodes of the first and second ECL output gate transistors and further comprising:
a stack of n voltage drop components having a negative temperature coefficient coupled between the high potential level power rail and a base node of the first ECL CCS gate transistor, and a third current sink coupled between the stack and low potential power rail for establishing a first voltage drop across the stack;
and a compensating reference voltage source coupled between the high potential power rail and a base node of the second ECL CCS gate transistor, said compensating reference voltage source being selected to provide a second voltage drop slightly greater than the first voltage drop at intermediate and high temperature ranges for normally operating the CCS gate with the first CCS gate transistor conducting a supplementary compensating current through the output voltage swing resistor coupled to the ECL output gate output node to permit low power operation of the first current sink;
said stack of voltage drop components being selected to provide a first voltage drop greater than the reference voltage source second voltage drop at a specified low temperature range of operation of the ECL output driver circuit to cut off the supplementary compensating current.

5. The ECL output driver circuit of claim 4 wherein the stack of n voltage drop components comprises a diode stack of n series coupled diodes.

6. The ECL output driver circuit of claim 5 wherein the diode stack comprises a stack of n series coupled base collector shorted (BCS) transistors providing the first voltage drop.

7. A method of operating an ECL output driver circuit for low power operation in a low temperature range, said ECL output driver circuit having an ECL output gate with first and second ECL output gate transistors with a first common emitter node coupling providing alternative collector paths through respective output voltage swing resistors according to data input signals at a base node input of one of the ECL output transistors, said ECL output gate providing an output node at the collector node of one of the ECL output gate transistors, comprising:
sinking a first current through the output voltage swing resistor in the collector current path of the first ECL gate output transistor, said output voltage swing resistor being coupled to the output node at the collector node of the first ECL gate transistor, said first current passing in a first current path through the first ECL output gate transistor and first common emitter node;
sinking a supplementary compensating second current through the output voltage swing resistor in the collector current path of the first ECL gate output transistor, and passing the second current through the output node and through a separate compensating current path to the low potential power rail in parallel with the first current path through the first ECL output gate transistor and first common emitter node, and maintaining said supplementary compensating current through said output voltage swing resistor during intermediate and high temperature operation of the ECL output driver circuit;
and switching off the supplementary compensating current through said output voltage swing resistor in a low temperature operating range of the ECL output driver circuit, said step of switching off the supplementary compensating current through said output voltage swing resistor comprising switching the supplementary compensating current in an ECL compensating current switch (CCS) gate from a first ECL CCS gate transistor coupled in the supplementary compensating current path to a second ECL CCS gate transistor coupled outside said supplementary compensating current path.

8. The method of claim 7 wherein the step of switching the supplementary compensating current in a low temperature range comprises:
coupling a stack of n voltage drop components having a negative temperature coefficient between a high potential power rail and a base node of the first ECL CCS gate transistor for defining a first voltage drop between the high potential power rail and base node of the first ECL CCS gate transistor;
providing a reference voltage source defining a reference second voltage drop between the high potential power rail and a base node of the second ECL CCS gate transistor;
and selecting the stack of n voltage drop components so that the first voltage drop is slightly less than the second voltage drop of the reference voltage source in intermediate and high temperature operating ranges of the ECL output driver circuit and so that the first voltage drop is slightly greater than the second voltage drop of the reference voltage source in a selected low temperature operating range of the ECL output driver circuit.

9. The method of claim 8 comprising the steps of providing a temperature compensating network between collector nodes of the first and second ECL output gate transistors, and supplementing bleed current provided by the temperature compensating network with said supplementary compensating current.

10. A temperature compensated ECL output driver circuit comprising an ECL output gate coupled between high and low potential power rails and having first and second ECL output gate transistors with a first common emitter node coupling providing alternative collector current paths through respective collector node output voltage swing resistors according to a data input signal at a base node input of one of the ECL output gate transistors, a first current sink coupled between the common emitter node coupling of the ECL output gate transistors and low potential power rail, at least one emitter follower transistor output circuit coupled to a collector output node of one of the ECL output gate transistors for delivering logic high and logic low potential level output signals at an output, and a temperature compensating network coupled between collector nodes of the respective ECL output gate transistors, the improvement for compensated operation of the ECL output driver circuit so that logic high output signals remain within a desired specification voltage range during operation at low power and low temperature comprising:

an ECL compensating current switch (CCS) gate comprising first and second CCS gate transistors with a second common emitter node coupling;

a second current sink coupled between said second common emitter node coupling and low potential power rail;

a diode stack of n series coupled $V_{BE}$ potential drop components having a negative temperature coefficient coupled between the high potential power rail and a base node of the first ECL CCS gate transistor and a third current sink coupled between said diode stack and low potential power rail;

and a compensating reference voltage source coupled between high potential power rail and a base node of the second ECL CCS gate transistor, said compensating reference voltage source being selected to provide a voltage drop slightly greater than $nV_{BE}$ at intermediate and high temperature operating ranges for formally operating the CCS gate with the first CCS gate transistor conducting a supplementary compensating current through the output voltage swing resistor at the output node of the ECL output gate to permit relatively low power operation of the first current sink;

said diode stack being selected to provide a voltage drop $nV_{BE}$ greater than the reference voltage source (V1) in a specified low temperature operating range of the ECL output driver circuit to cut off the supplementary compensating current through said output voltage swing resistor in the low temperature operating range for maintaining a relatively low voltage drop across the output voltage swing resistor at the collector output node so that logic high potential level output signals remain within a desired specification voltage range during operation at low power and low temperature.

11. The ECL output driver circuit of claim 10 wherein the diode stack comprises a stack of n series coupled base collector shorted (BCS) transistors providing the negative temperature coefficient voltage drop $nV_{BE}$.

12. The ECL output driver circuit of claim 11 wherein the output voltage swing resistor at the output node is selected to have a resistance value less than approximately 1.8 times the resistance value of a tail resistor of the first current sink.

13. A temperature compensated ECL output driver circuit comprising an ECL output gate having an output voltage swing resistor coupled to an output node, the improvement for operation of the ECL output driver circuit at low power and low temperature comprising:

a compensating current source coupled to the ECL output gate output node for generating a supplementary compensating current during operation of the ECL output driver circuit in a first temperature operating range in a compensating current path through the output voltage swing resistor;

and a compensating current switch coupled in the compensating current path and constructed for switching off the supplementary compensating current during operation of the ECL output driver circuit in a specified second temperature operating range lower than the first temperature operating range, said compensating current switch being an ECL compensating current switch (CCS) gate, said compensating current source being a current sink coupled between the ECL CCS gate and a low potential power rail.

14. The ECL output driver circuit of claim 13 wherein the compensating current switch is an ECL compensating current switch (CCS) gate comprising first and second CCS gate transistors with a common emitter node coupling, the first CCS gate transistor being coupled in a compensating current path between the ECL output gate output node and common emitter node, and wherein the compensating current source is a current sink coupled between the common emitter node and a low potential power rail.

15. The ECL output driver circuit of claim 14 wherein the ECL output gate comprises an emitter follower transistor output circuit coupled to the ECL output gate output node for delivering logic high and logic low potential level output signals at an output, and further comprising:

a stack of n voltage drop components having a negative temperature coefficient coupled between a high potential level power rail and a base node of the first ECL CCS gate transistor, and a current sink coupled between the stack and low potential power rail for establishing a first voltage drop across the stack;

and a compensating reference voltage source coupled between the high potential power rail and a base node of the second ECL CCS gate transistor, said compensating reference voltage source being selected to provide a second voltage drop slightly greater than the first voltage drop at said first temperature range for normally operating the CCS gate with the first CCS gate transistor conducting a supplementary compensating current through the output voltage swing resistor coupled to the ECL output gate output node;

said stack of voltage drop components being selected to provide a first voltage drop greater than the reference voltage source second voltage drop at the specified second temperature range of operation of the ECL output driver circuit lower than the first temperature operating range to cut off the supplementary compensating current.

16. A method of operating an ECL output driver circuit for low power operation in a low temperature range, said ECL output driver circuit comprising an ECL output gate having an output voltage swing resistor coupled to an output node, comprising:

sinking a first current through the output voltage swing resistor and output node in a first current path of the ECL output gate;

sinking a supplementary compensating second current through the output voltage swing resistor, and passing the second current through the output node and through a separate compensating current path to a low potential power rail in parallel with the first current path through the first ECL output gate, and maintaining said supplementary compensating current through said output voltage swing resistor during a first operating temperature range of the ECL output driver circuit;

and switching off the supplementary compensating current through said output voltage swing resistor in a second temperature operating range of the ECL output driver circuit lower than the first operating temperature range, said step of switching off the supplementary compensating current through said output voltage swing resistor comprising switching the supplementary compensating current in an ECL compensating current switch (CCS) gate from a first ECL CCS gate transistor coupled in the supplementary compensating current path to a second ECL CCS gate transistor coupled outside said supplementary compensating current path.

17. The method of claim 16 wherein the step of switching the supplementary compensating current in a low temperature range comprises:

coupling a stack of n voltage drop components having a negative temperature coefficient between a high potential power rail and a base node of the first ECL CCS gate transistor for defining a first voltage drop between the high potential power rail and base node of the first ECL CCS gate transistor;

providing a reference voltage source defining a reference second voltage drop between the high potential power rail and a base node of the second ECL CCS gate transistor;

and selecting the stack so that the first voltage drop is slightly less than the second voltage drop of the reference voltage source in the first temperature operating range of the ECL output driver circuit and so that the first voltage drop is slightly greater than the second voltage drop of the reference voltage source in the second temperature operating range of the ECL output driver circuit.

* * * * *